(12) United States Patent
Koh

(10) Patent No.: US 6,320,422 B1
(45) Date of Patent: Nov. 20, 2001

(54) COMPLEMENTARY SOURCE COUPLED LOGIC

(75) Inventor: Yongseon Koh, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/448,322

(22) Filed: Nov. 23, 1999

(51) Int. Cl.$^7$ .................................................. H03K 19/094
(52) U.S. Cl. ........................ 326/115; 326/126; 326/127; 326/112
(58) Field of Search ............................ 326/83, 115, 126, 326/127, 119, 121, 112

(56) References Cited

U.S. PATENT DOCUMENTS

| | | | |
|---|---|---|---|
| 4,021,751 | * | 5/1977 | Suzuki ................................. 330/15 |
| 5,909,146 | * | 6/1999 | Okada .................................. 330/255 |
| 5,959,475 | * | 9/1999 | Zomorrodi ........................... 327/112 |

OTHER PUBLICATIONS

B. Razavi, "Design of Monolithic Phase–Locked Loops and Clock Recovery Circuits–A Tutorial", IEEE Press, 1996.

* cited by examiner

*Primary Examiner*—Michael Tokar
*Assistant Examiner*—Anh Q. Tran
(74) *Attorney, Agent, or Firm*—Beyer Weaver & Thomas, LLP

(57) ABSTRACT

A complementary source coupled logic topology suitable for low voltage differential signaling is disclosed. The topology is referred to as complementary source coupled logic as it contains complementary differential paris and complementary source follows. The complementary differential pair provide low voltage swing, low gain, high bandwidth signaling with rail-to-rail input common-mode range. The complementary source followers combine and buffer the outputs of complementary differential pairs preserving the low voltage swing, low gain and high bandwidth.

28 Claims, 3 Drawing Sheets

COMPLEMENTARY SOURCE COUPLED LOGIC

BACKGROUND OF INVENTION

1. Field of the Invention

The present invention relates to differential logic circuits and, more particularly, to differential logic circuits suitable for low voltage differential signaling.

2. Description of the Related Art

Electrical circuits have used differential logic circuits for many years. Early single-ended bipolar digital logic families, such as Resistor-Transistor Logic (RTL), Diode-Transistor Logic (DTL), and Transistor-Transistor Logic (TTL), which made use of a saturating transistor inverter and large signal swing, exhibited large propagation delay time because of their saturation delay time. To overcome the saturation delay, differential logic families based on non-saturating current switches and low signal swing, such as Current Mode Logic (CML), Emitter Coupled Logic (ECL), and Positively-referenced Emitter Coupled Logic (PECL), have been widely used in bipolar integrated circuits. CML is the simplest form of differential logic in bipolar integrated circuits. The poor capacitive drive of CML was later overcome in ECL by coupling the differential output by an emitter follower.

The counterparts of CML and ECL in bipolar integrated circuits are obtainable in Complementary Metal Oxide Semiconductor (CMOS) integrated circuits, and they are referred to as Current Mode Logic (CML) and Source Coupled Logic (SCL), respectively.

FIG. 1 is a schematic diagram of a conventional n-type SCL circuit 100. The n-type SCL circuit 100 is composed of n-type CML differential pair and two n-type single-ended source followers. The n-type CML differential pair includes transistors 102 and 104, load transistors 106 and 108, and a current source (Is). The transistors 102 and 104 are coupled to a supply voltage ($V_{DD}$) through the load transistors 106 and 108. The transistors 102 and 104 receive a differential input (IN+ and IN−). The load transistors 106 and 108 are biased by a bias voltage signal. The current source (Is) 110 couples the commonly connected sources of the transistors 102 and 104 to ground. A first of the n-type single-ended source followers includes a transistor 112 and a current source (Is) 114, and a second of the n-type single-ended source followers includes a transistor 116 and a current source (Is) 118. Similarly, the p-type SCL is composed of a p-type CML differential pair and two p-type source followers.

Both CML and SCL operate with low signal swing as required for high-speed operation. The SCL may potentially operate at higher speed since the source followers in SCL isolate the capacitive loading from the drains of CML differential pair. Furthermore the SCL is well suited for driving large impedance loads because of its low output impedance.

FIG. 2 is a schematic diagram of a low-voltage variable-delay gain stage circuit 200 that is known in the art. The low-voltage variable-delay gain stage circuit 200 is a Complementary Metal Oxide Semiconductor (CMOS) device that can operate at lower operating voltages than could earlier designs due to the PMOS load biased by NMOS source follower and the folded PMOS control stage to avoid stacking.

The low-voltage variable-delay gain stage circuit 200 uses NMOS source followers 202 and 204 which bias load transistors 206 and 208 (p-type transistors), respectively. Further, the low-voltage variable-delay gain stage 200 includes a differential pair including n-type transistors 210 and 212. The transistors 210 and 212 form a differential pair and have their sources commonly coupled to ground through a current source 218. The outputs for the low-voltage variable-delay gain stage 200 are obtained from the drains of the transistors 210 and 212 of the differential pair. The low-voltage variable-delay gain stage 200 also includes gain-control circuitry 220. Here, the cross-coupled transistors 222 and 224 biased by current source 226 introduce a negative resistance equal to $-2/g_m$, where $g_m$ denotes the average transconductance of transistors 222 and 224. This negative resistance partially cancels the resistance at the drain of the load transistors 206 and 208, increasing the effective output impedance and hence the delay. Transistors 228 and 230 receive a control voltage and change the amount of current flowing through the transistors 210 and 212 versus transistors 222 and 224.

The low-voltage variable-delay gain stage 200 uses PMOS loads (i.e., p-type load transistors 206 and 208) biased by NMOS source follower (i.e., n-type transistor 202 and 204). The advantage of the use of the NMOS source followers to bias the PMOS loads, as opposed to a constant reference voltage being used to bias the loads, is that an extended constant $R_{on}$ is maintained across the load transistors 206 and 208 in the triode region. The outputs are obtained from the drains of the differential pair (210 and 212), and thus, the logic topology of the low-voltage variable-delay gain stage 200 is CML.

The CML and SCL topologies are applicable to both intra-chip building blocks and inter-chip interface. When CML and SCL are used for interface, they require impedance matched loads terminated to a fixed voltage. More recently, the Low Voltage Differential Signaling (LVDS) standard has been developed to provide yet another form of differential interface. LVDS requires impedance-matched loads only, and does not require a fixed termination voltage. Thus, LVDS can be used between a transmitter and a receiver that have ground shift. However, the ground shift imposes that the receiver should accommodate the input common mode variation resulting from it. The current LVDS standard specifies that the DC level of the receiver output is at 1.2V and ground shift up to ±1.2V is allowed, which impose minimum 0 to 2.4V of input common mode range at the receiver. This common mode range is almost equivalent to rail-to-rail in 2.5V supply.

The differential pairs in CML or SCL have limited input common-mode range. The n-type differential pair operates from $V_{TN}$ to $V_{DD}$ and the p-type differential pair operates from $V_{SS}$ to $V_{DD}-V_{TP}$, where $V_{DD}$ and $V_{SS}$ are supply voltage voltages and $V_{TN}$ and $V_{TP}$ are threshold voltages of the n-type and p-type transistors, respectively. In order to accommodate the rail-to-rail input common mode range, both n-type and p-type differential pairs are often used and the output signals of both pairs should be combined.

The conventional approach to combine the outputs of an n-type and a p-type differential pair is to mirror the currents of one type and add the current to a summing node. This approach is applicable only to CML, but not to SCL without loss of bandwidth. Thus, there is a need for ways to combine the outputs of n-type and p-type SCL pairs.

SUMMARY OF THE INVENTION

Broadly speaking, the invention relates to a Complementary Source Coupled Logic (CSCL) topology suitable for low voltage differential signaling. The Complementary Source Coupled Logic topology is referred to as Complementary Source Coupled Logic as it contains both n-type and p-type Source Coupled Logic (SCL) topology. The CSCL topology can be used to form any differential Boolean logic design, but is particularly well suited for buffering small signal differential signals with large input common-mode range.

The invention can be implemented in numerous ways, including as a computer system, an apparatus, and a method. Several embodiments of the invention are discussed below.

As a differential circuit having a high bandwidth over a rail-to-rail common mode range, one embodiment of the invention includes: a first differential pair receiving first and second differential inputs; a first pair of active loads coupled between said first differential pair and a first power source; a first current source coupled between the first differential pair and a second power source; a second differential pair receiving the first and second differential inputs; a second pair of active loads coupled between the second differential pair and the second power source; a second current source coupled between the second differential pair and the first power source; a first complementary source follower coupled to a first node between the first of the first pair of the active loads and the first differential pair and coupled to a first node between the a first of the second pair of the active loads and the second differential pair; and a second complementary source follower coupled to a second node between the second of the first pair of the active loads and the first differential pair and coupled to a second node between the second of the second pair of the active loads and the second differential pair.

As a low voltage differential signaling circuit using complementary source coupled logic, the low voltage differential signaling circuit comprising: an n-type differential pair receiving first and second differential inputs; a first pair of active loads coupled between the n-type differential pair and a first power source; a first current source coupled between the n-type differential pair and a second power source; a p-type differential pair receiving the first and second differential inputs; a second pair of active loads coupled between the p-type differential pair and the second power source; a second current source coupled between the second differential pair and the first power source; a first complementary source follower coupled to a first node between the first of the first pair of the active loads and the n-type differential pair and coupled to a first node between the first of the second pair of the active loads and the p-type differential pair, the first source follower producing a first differential output at a first output node; and a second complementary source follower coupled to a second node between the second of the first pair of the active loads and the n-type differential pair and coupled to a second node between the second of the second pair of the active loads and the p-type differential pair, the second complementary source follower producing a second differential output at a second output node.

As a low voltage differential signaling circuit including a first type differential pair and a pair of first type source followers, wherein according to one embodiment of the invention, the improvement includes a second type differential pair, the second type being complementary to the first type, and the pair of source followers are complementary source followers that are shared by the pair of complementary type differential pairs.

The invention has numerous advantages. One advantage of the invention is extended rail-to-rail input common mode range. Another advantage of the invention is that very high frequency (or high bandwidth) operation is obtainable. Still another advantage of the invention is that it yields good drive capabilities.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The invention relates to a complementary source coupled logic topology suitable for high speed low voltage differential signaling. The topology is referred to as complementary source coupled logic as it contains both n-type and p-type source coupled logic. The two different types of differential pairs detect input signal from rail-to-rail and provides both n-type and p-type outputs. The complementary source followers then combine and buffer the outputs of the complementary differential pairs.

Conventionally complementary designs, when combining p-type and n-type in a complementary fashion, tend to use current mirrors and current summers (i.e., wired OR) to mirror currents to the opposite type devices. Unfortunately, such conventional approaches are slow and thus not suitable for high-speed operation. The invention offers a gate-efficient, high-speed (high-bandwidth) logic topology. The invention uses a complementary source follower at each differential output. The complementary source followers provide low output impedance and good drive capability without extra transistors. Overall, the logic topology can provide low gain and very high bandwidth together with a rail-to-rail input common mode range.

Embodiments of the invention are discussed below with reference to FIGS. 3–4. However, those skilled in the art will readily appreciate the detailed description given herein with respect to these figures is for explanatory purposes as the invention extends beyond these limited embodiments.

Figure 1:
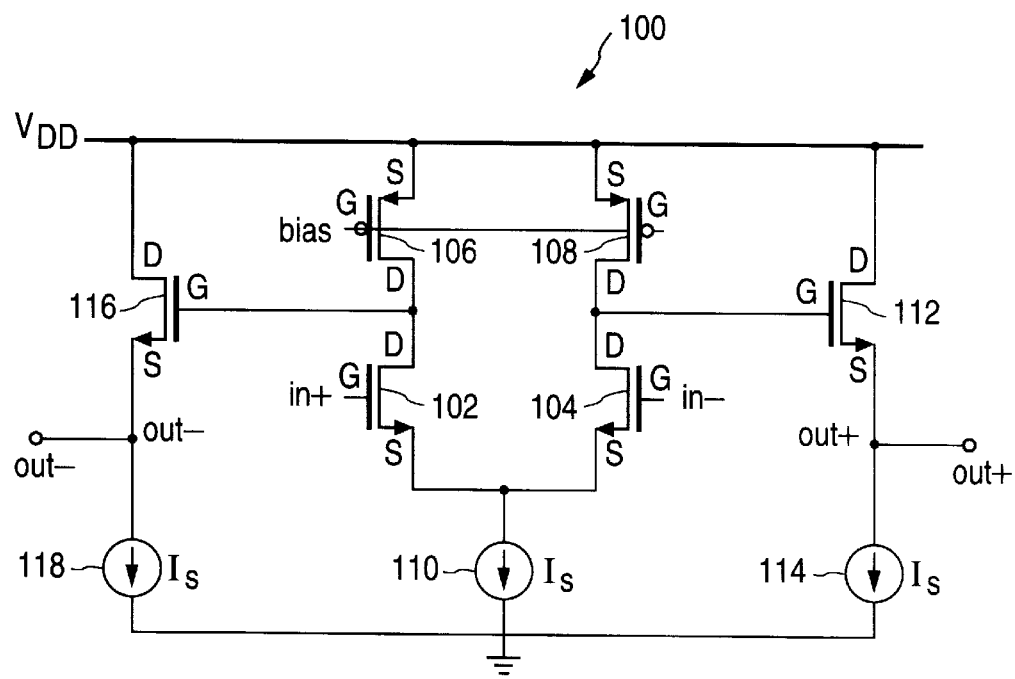
FIG. 1 is a schematic diagram of a conventional Source Coupled Logic (SCL) circuit.
Figure 2:
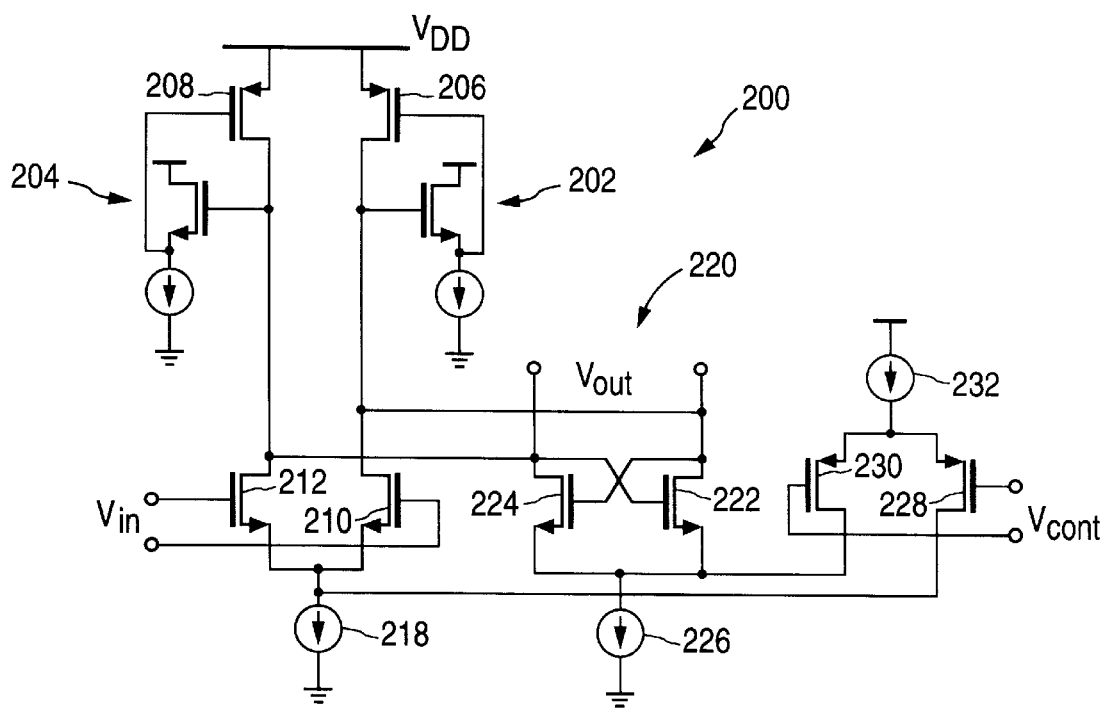
FIG. 2 is a schematic diagram of a low-voltage variable-delay gain stage circuit that is known in the art.
Figure 3:
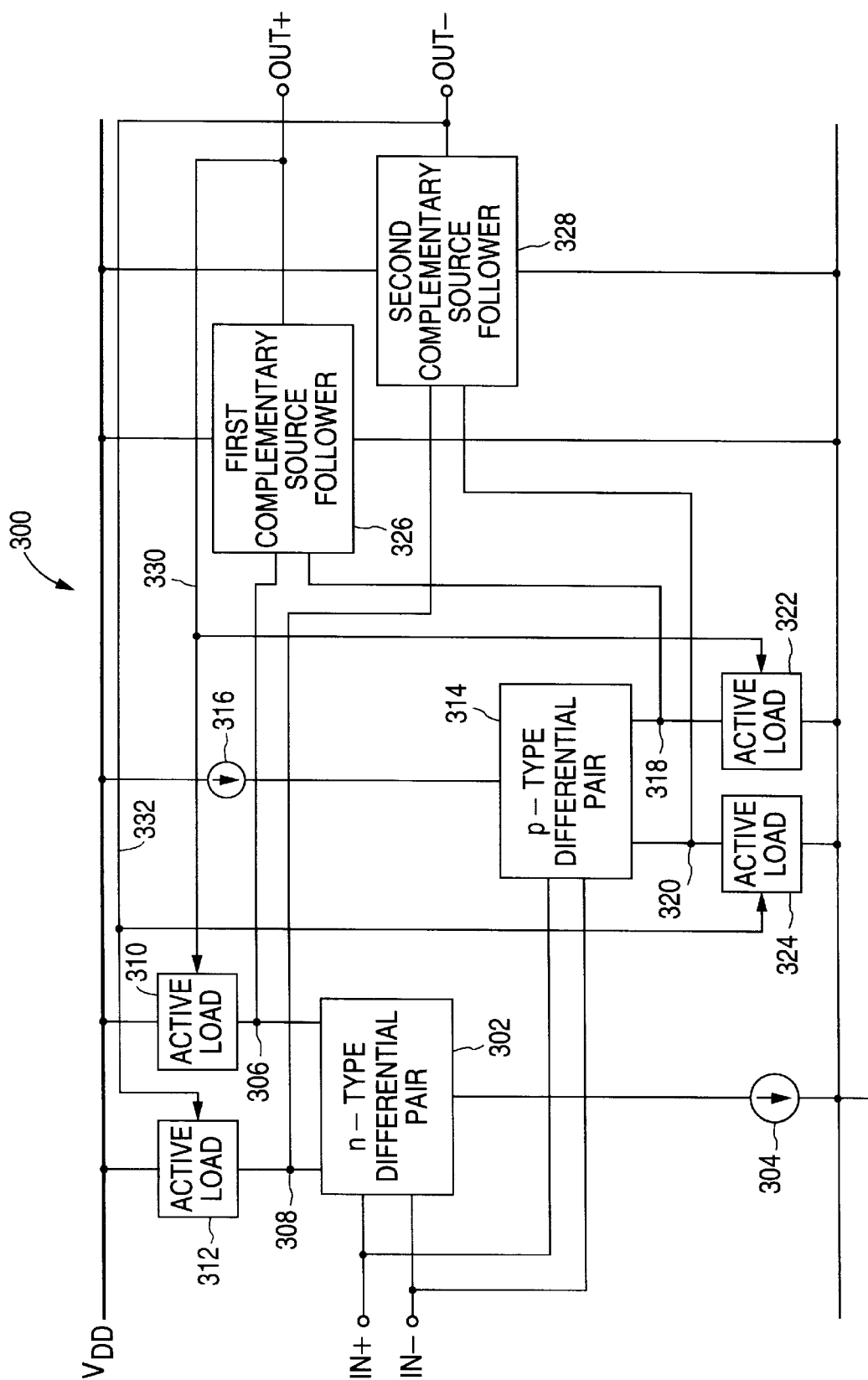
FIG. 3 is a block diagram of a complementary source coupled logic circuit according to one embodiment of the invention.

FIG. 3 is a block diagram of a complementary source coupled logic circuit 300 according to one embodiment of the invention. The complementary source coupled logic circuit 300 includes an n-type differential pair 302 that receives differential inputs (IN+ and IN−) at input terminals. The n-type differential pair 302 is coupled to ground through a current source 304. The n-type differential pair 302 also has a first output node 306 and a second output node 308. The first output node 306 is coupled to supply voltage ($V_{DD}$) through an active load 310, and the second output node 308 is coupled to the supply voltage ($V_{DD}$) though an active load 312.

The complementary source coupled logic circuit 300 also includes a p-type differential pair 314. The p-type differential pair 314 also receive the differential inputs (IN+ and IN−) to its input terminals as does the n-type differential pair 302. The p-type differential pair 314 is coupled to the supply voltage ($V_{DD}$) through a current source 316. The p-type differential pair 314 also has a first output node 318 and a second output node 320. The first output node 318 is coupled to ground through an active load 322, and the second output node 320 is coupled to ground through an active load 324.

In addition, the complementary source coupled logic circuit 300 also includes a first complementary source follower 326 and a second complementary source follower 328. The first complementary source follower 326 is coupled to the first output node 306 of the n-type differential pair 302 and to the first output node 318 of the p-type differential pair 314. The first complementary source follower 326 outputs a first differential output (OUT+). The second complementary source follower 328 is coupled to the second output node 308 of the n-type differential pair 302 and to the second output node 320 of the p-type differential pair 314. The second complementary source follower 328 outputs a second differential output (OUT−).

Further, the complementary source coupled logic circuitry 300 provides a feedback path 330 from the output of the first complementary source follower 326 to the active load 310 associated with the n-type differential pair 302 as well as the active load 322 associated with p-type differential pair 314. Similarly, the complementary source coupled logic circuitry 300 also provides a feedback path 332 from the output of the second complementary source follower 328 to the active load 312 associated with p-type differential pair 314. The feedback provided by the feedback paths 330 and 332 serve to bias the active loads 310, 312, 322 and 324 in their triode operational region where the impedance is low and $R_{on}$ is approximately constant. The triode operational region is the region of operation of a transistor where the drain current $I_{DS}$ changes approximately linearly with respect to the drain voltage $V_{DS}$. At the edge of triode region and the beginning of saturation region, the resistance rapidly changes. Thus, the feedback operates to gradually change the gate voltage $V_{GS}$ so that the triode operational region is extended and thus $R_{on}$ is maintained approximately constant. With n-type active loads, the feedback gradually increases $V_{GS}$, and with p-type active loads, the feedback gradually decreases $V_{GS}$. As a result, the n-type pair 302 and the p-type pair 314 achieve low-gain yet high-bandwidth, and the output nodes 308 and 306 of the n-type differential pair 302 and the outputs nodes 318 and 320 of the p-type differential pair 314 achieve low signal swings.

Moreover, the outputs of the two differential pairs 302 and 314 are combined directly by the two complementary source followers 326 and 328. A complementary source follower is referred to as a complementary source follower since it is composed of an n-type source follower and a p-type source follower. In complementary source followers, the sources of the two different types of source followers are connected together and one type of source follower acts as the current source for the other type of source follower. Conventionally, a source follower includes a transistor and a current source, where the current source is either a passive resistor or a transistor current source with DC-biased gate and high output impedance at the drain. In contrast, according to this embodiment of the invention, when one of the source followers in the complementary source follower is used as current source, the gate is biased by the output of the differential pair of the same type and the output current is available at the source with low impedance. Thus, when one of the source followers acts as a current source, it does not act as efficiently as conventional current sources and thus, results in reduced gain at the output of the source follower. However, low gain is desired in high-speed operation, since it reduces the swing and increases the bandwidth. Furthermore, complementary source followers offer an efficient method of combining the outputs of two differential pairs directly into a low impedance node without mirroring and summing currents.

Outputs from the complementary source coupled logic circuit 300 are taken from low impedance nodes of the first and second complementary source followers 326 and 328. Hence, the resulting complementary outputs produced by the complementary source coupled logic circuit 300 have low gain, high bandwidth and good drive capabilities. The complementary source coupled logic circuit is also efficient in that other additional circuitry is not need to bias the active loads or the current sources.

Figure 4:
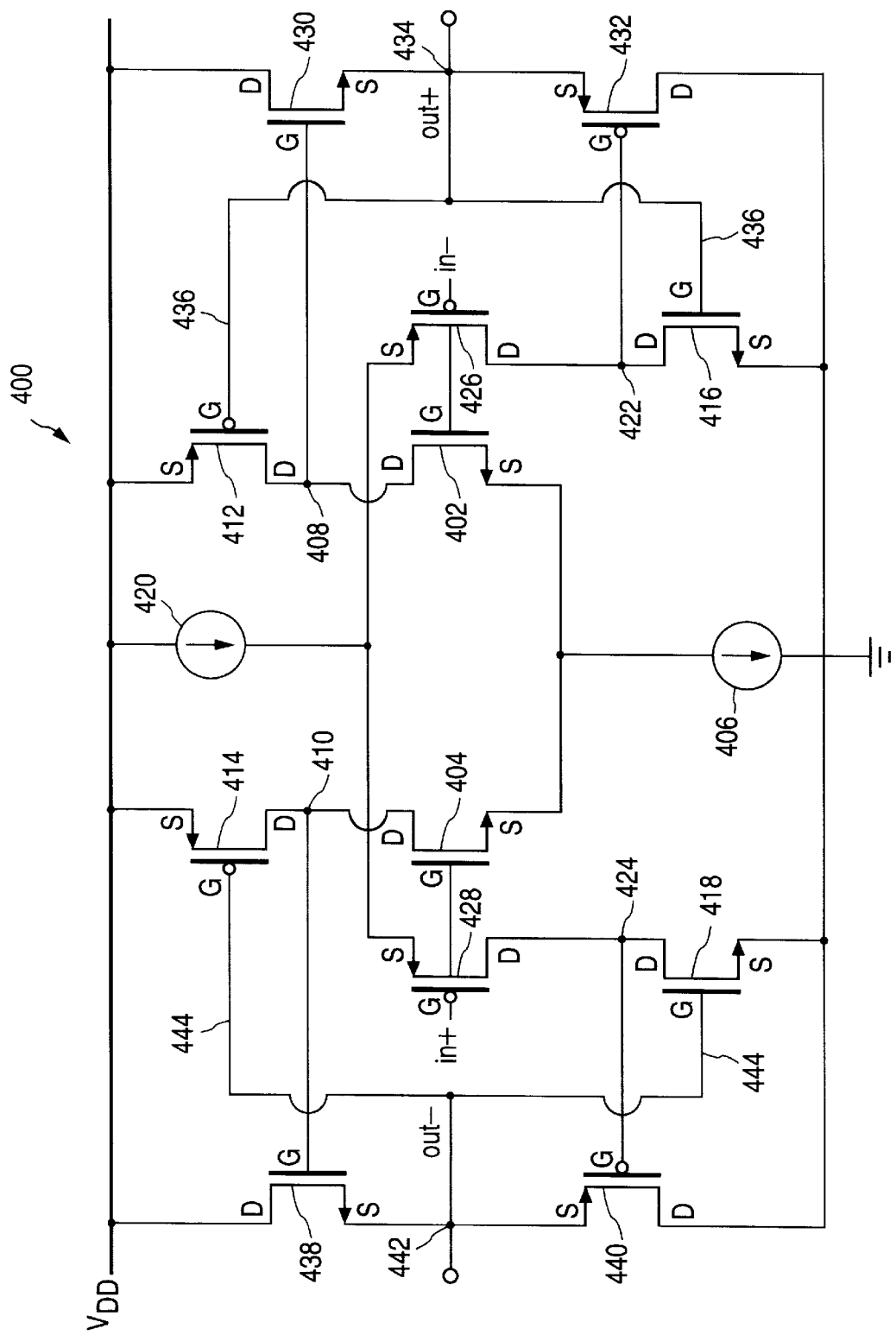
FIG. 4 is a schematic diagram of a complementary source coupled logic circuit according to one embodiment of the invention.

FIG. 4 is a schematic diagram of a complementary source coupled logic circuit 400 according to one embodiment of the invention. The complementary source coupled logic 400 is, for example, a more detailed embodiment of the complementary source coupled logic 300 illustrated in FIG. 3. In this embodiment, the complementary source coupled logic 400 is a complementary metal oxide semiconductor (CMOS) device. The complementary source coupled logic circuit 400 offers high-speed operation, as well as rail-to-rail input common mode range. Still further, the complementary source coupled logic circuit 400 provides low impedance from complementary source followers.

The complementary source coupled logic circuit 400 includes transistors 402 and 404 which have their source terminals commonly coupled to ground through current source 406. The transistors 402 and 404 form a first differential pair. In this embodiment, the transistors are n-type transistors and thus the first differential pair can be classified as an n-type differential pair. The various transistors of the complementary source coupled logic circuit 400, including the transistors 402 and 404, are assumed to be Field Effect Transistors (FETs) with each having a drain terminal, a gate terminal, and a source terminal.

The drain terminal of the transistor 402 is coupled to a node 408 and the drain terminal of the transistor 404 is coupled to a node 410. The nodes 408 and 410 can be considered output nodes or output terminals of the first differential pair. The complementary source coupled logic circuit 400 also includes transistors 412 and 414 that serve as active loads for the first differential pair. More particularly, the transistor 412 is coupled between a supply voltage (or power supply) ($V_{DD}$) and the node 408. The transistor 414 is coupled between the supply voltage ($V_{DD}$) and the node 410.

The complementary source coupled logic circuit 400 also includes transistor 416 and 418 that together form a second differential pair. The source terminals of the transistor 416 and 418 are commonly coupled to the supply voltage ($V_{DD}$) through a current source 420. The transistors 416 and 418 form a second differential pair. In this embodiment, the transistors are p-type transistors and thus the second differential pair can be classified as a p-type differential pair.

The drain terminal of the transistor 416 is coupled to a node 422 and the drain terminal of the transistor 418 is coupled to a node 424. The nodes 422 and 424 can be considered output nodes or output terminals of the second differential pair. The complementary source coupled logic circuit 400 also includes transistor 426 and 428 that serve as active loads for the second differential pair. More particularly, the transistor 426 is coupled between ground and node 422. The transistor 414 is coupled between ground and the node 424.

The complementary source coupled logic circuit 400 also included a first complementary source follower consisting of transistor 430 and 432. The first complementary source follower is complementary because each of the transistors 430 and 432 is of a different type. In this embodiment, the transistor 430 is an n-type transistor and the transistor 432 is a p-type transistor. More particularly, the transistor 430 of the first complementary source follower has a drain terminal connected to a supply voltage ($V_{DD}$), a gate terminal connected to the node 408, and a source terminal connected to a first differential output (OUT+) at output node 434. The transistor 432 has a source terminal connected to the output node 434, a gate terminal connected to node 422, and a drain terminal connected to ground.

In addition, the complementary source coupled logic circuit 400 includes a second complementary source follower consisting of transistor 438 and 440. The second complementary source follower is complementary because each of the transistors 438 and 440 is of a different type. In this embodiment, the transistor 438 is an n-type transistor and the transistor 440 is a p-type transistor. More particularly, the transistor 438 of the first complementary source follower has a drain terminal connected to the supply voltage ($V_{DD}$), a gate terminal connected to the node 410, and a source terminal connected to a second differential output (OUT−) at output node 442. The transistor 440 has a source terminal connected to the output node 442, a gate terminal connected to node 424, and a drain terminal connected to ground.

Further, to provide feedback from the output node 434 to the transistors 412 and 426 serving as active loads for the first differential pair, a feedback link 436 is provided. Specifically, the feedback link 436 operates to bias the transistors 412 and 426 by supplying a feedback signal to the gate terminals of the transistors 412 and 426 via the feedback link 436. The biasing of the transistors 412 and 426 serves to operate the transistors 412 and 426 in the triode region which improves voltage swing by maintaining the impedance of the active loads (transistors 412 and 426) low. Here, the transistor 430 of the first complementary source follower acts as a current source for the transistor 432, and the transistor 432 of the first complementary source follower acts as the current source for the transistor 430. Accordingly, the first complementary source follower is shared by one side of both the first and second differential pairs.

Similarly, to provide feedback from the output node 442 to the transistors 414 and 428 serving as active loads for the first differential pair, a feedback link 444 is provided. Specifically, the feedback link 444 operates to bias the transistors 414 and 428 by supplying a feedback signal to the gate terminals of the transistors 414 and 428 via the feedback link 444. The biasing of the transistors 414 and 428 serves to operate the transistors 414 and 429 in the triode region which improves voltage swing by maintaining the impedance of the active loads (transistors 414 and 428) low. Here, the transistor 438 of the first complementary source follower acts as a current source for the transistor 440, and the transistor 440 of the first complementary source follower acts as the current source for the transistor 438. Accordingly, the first complementary source follower is shared by one side of both the first and second differential pairs.

The SCL circuit enables a wide variety of high-speed signaling. The SCL is suitable for differential logic designs including Boolean operations (e.g., AND, OR, XOR), selectors, or multiplexers. The SCL is also suitable for buffers using low-swing high-speed differential signals.

Conventional SCL circuits have limited input common-mode range. The input common-mode range of an n-type SCL circuit is from ($V_{SS}+V_{TN}$) to $V_{DD}$ and the input common-mode range of a p-type SCL circuit is from $V_{SS}$ to ($V_{DD}-V_{TP}$), where the threshold voltages $V_{TN}$ or $V_{TP}$ are approximately 0.6 Volts. However, the limited input common-mode range of SCL is extended to rail-to-rail using complementary source followers in CSCL. According to the invention, the input common-mode of CSCL can extend from $V_{SS}$ to $V_{DD}$.

Furthermore, CSCL can achieve extended common-mode while maintaining the bandwidth of SCL. The complementary source coupled logic circuit 400 shown in FIG. 4 can, for example, support a signal bandwidth of 5 Giga Hertz (GHz) and a data rate in excess of 5 Giga bits per second (Gbps) in standard 0.25 um CMOS process. In addition, the CSCL circuits are scalable with process technology. The CSCL circuits can, for example, be implemented in a 0.18, 0.25, or 0.35 um CMOS process.

The CSCL circuit according to invention is particularly well suited to buffer the low-swing high-speed signals with large input common-mode variation, e.g., as LVDS input receivers which can accommodate rail-to-rail input common-mode variation.

The invention has numerous advantages. One advantage of the invention is the rail-to-rail input common-mode range, which is required by LVDS standard. Another advantage of the invention is that very high frequency (or high-bandwidth) operation is obtainable. Still another advantage of the invention is that it yields good drive capabilities.

The many features and advantages of the present invention are apparent from the written description and, thus, is intended by the appended claims to cover all such features and advantages of the invention. Further, since numerous modification and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A differential circuit having a high bandwidth over a rail-to-rail common mode range, said differential circuit comprising:

a first differential pair receiving first and second differential inputs;

a first pair of active loads coupled between said first differential pair and a first power source;

a first current source coupled between said first differential pair and a second power source;

a second differential pair receiving the first and second differential inputs;

a second pair of active loads coupled between said second differential pair and said second power source;

a second current source coupled between said second differential pair and said first power source;

a first complementary source follower coupled to a first node between the first of said first pair of the active loads and said first differential pair and coupled to a first node between the first of said second pair of the active loads and said second differential pair; and a second complementary source follower coupled to a second node between the second of said first pair of the active loads and said first differential pair and coupled to a second node between the second of said second pair of the active loads and said second differential pair.

2. A differential circuit as recited in claim 1, wherein said differential circuit further comprises:
   a first current source coupled between said first differential pair and the second power source; and
   a second current source coupled between said second differential pair and the first power source.

3. A differential circuit as recited in claim 2, wherein each of said first pair of active loads comprises a transistor, and wherein each of said second pair of active loads comprises a transistor.

4. A differential circuit as recited in claim 1, wherein said first complementary source follower produces a first differential output, and said second complementary source follower produces a second differential output.

5. A differential circuit as recited in claim 4, wherein the first differential output is fed back to the first ones of the first and second pairs of the active loads, and wherein the second differential output is fed back to the second ones of the first and second pairs of the active loads.

6. A differential circuit as recited in claim 5, wherein each of said first pair of active loads comprises a transistor, and wherein each of said second pair of active loads comprises a transistor.

7. A differential circuit as recited in claim 6, wherein the transistors within each of said first pair of active loads and said second pair of active loads are MOS gates having a source terminal, a gate terminal, and a drain terminal, and
   wherein the first differential output is fed back to the gate terminals of the transistors associated with the first ones of the first and second pairs of the active loads, and the second differential output is fed back to the gate terminals of the transistors associated with the second ones of the first and second pairs of the active loads.

8. A differential circuit as recited in claim 7,
   wherein said first complementary source follower comprises a first type transistor and a second type transistor coupled together at a first output node, the first differential output being obtained from the first output node, and
   wherein said second complementary source follower comprises a first type transistor and a second type transistor coupled together at a second output node, the second differential output being obtained from the first output node.

9. A differential circuit as recited in claim 8, wherein said first type differential pair comprises a pair of first type transistors, and wherein said second type differential pair comprises a pair of second type transistors.

10. A differential circuit as recited in claim 1, wherein said first type differential pair comprises a pair of first type transistors, and wherein said second type differential pair comprises a pair of second type transistors.

11. A differential circuit as recited in claim 1, wherein the first and second differential inputs are low voltage differential signals.

12. A low voltage differential signaling circuit using complementary source coupled logic, said low voltage differential signaling circuit comprising:
   an n-type differential pair receiving first and second differential inputs;
   a first pair of active loads coupled between said n-type differential pair and a first power source;
   a first current source coupled between said n-type differential pair and a second power source;
   a p-type differential pair receiving the first and second differential inputs;
   a second pair of active loads coupled between said p-type differential pair and said second power source;
   a second current source coupled between said second differential pair and said first power source;
   a first complementary shared source follower coupled to a first node between the first of said first pair of the active loads and said n-type differential pair and coupled to a first node between the first of said second pair of the active loads and said p-type differential pair, said first source follower producing a first differential output at a first output node; and
   a second complementary source follower coupled to a second node between the second of the first pair of the active loads and said n-type differential pair and coupled to a second node between the second of the second pair of the active loads and said p-type differential pair, said second source follower producing a second differential output at a second output node.

13. A low voltage differential signaling circuit as recited in claim 12, wherein said first complementary source follower comprises:
   an n-type transistor having a gate terminal connected to the first node between the first of said first pair of the active loads and said n-type differential pair, a drain terminal connected to the first power source, and a source terminal connected to the first output node; and
   a p-type transistor having a gate terminal connected to the first node between the first of said second pair of the active loads and said p-type differential pair, a source terminal connected to the first output node, and a drain terminal connected to the second power source.

14. A low voltage differential signaling circuit as recited in claim 13, wherein said second complementary source follower comprises:
   an n-type transistor having a gate terminal connected to the second node between the second of said first pair of the active loads and said n-type differential pair, a drain terminal connected to the first power source, and a source terminal connected to the second output node; and
   a p-type transistor having a gate terminal connected to the second node between the second of said second pair of the active loads and said p-type differential pair, a source terminal connected to the second output node, and a drain terminal connected to the second power source.

15. A low voltage differential signaling circuit as recited in claim 14,
   wherein said n-type differential pair comprises a pair of transistors having their source terminals commonly connected to said second current source, and
   wherein said p-type differential pair comprises a pair of transistors having their source terminals commonly connected to said first current source.

16. A low voltage differential signaling circuit as recited in claim 12,
   wherein said n-type differential pair comprises a pair of transistors having their source terminals commonly connected to said second current source, and
   wherein said p-type differential pair comprises a pair of transistors having their source terminals commonly connected to said first current source.

17. A low voltage differential signaling circuit as recited in claim 12, wherein the first differential output is fed back to the first ones of the first and second pairs of the active loads, and wherein the second differential output is fed back to the second ones of the first and second pairs of the active loads.

18. A low voltage differential signaling circuit as recited in claim 12, said low voltage differential signaling circuit further comprises:

a first feedback line from the first output node to the first ones of the first and second pairs of the active loads; and a second feedback line from the second output node to the second ones of the first and second pairs of the active loads.

19. A low voltage differential signaling circuit as recited in claim 18, wherein each of the first and the second of said first pair of the active loads are transistors, and wherein each of the first and the second of said second pair of the active loads are transistors.

20. A low voltage differential signaling circuit as recited in claim 19, wherein said first feedback line connects the first output node to gate terminals of the transistors corresponding to the first ones of the first and second pairs of the active loads, and wherein said second feedback line connects the second output node to gate terminals of the transistors corresponding to the second ones of the first and second pairs of the active loads.

21. A low voltage differential signaling circuit as recited in claim 18, wherein said first complementary source follower comprises:

an n-type transistor having a gate terminal connected to the first node between the first of said first pair of the active loads and said n-type differential pair, a drain terminal connected to the first power source, and a source terminal connected to the first output node; and a p-type transistor having a gate terminal connected to the first node between the first of said second pair of the active loads and said p-type differential pair, a source terminal connected to the first output node, and a drain terminal connected to the second power source.

22. A low voltage differential signaling circuit as recited in claim 21, wherein said second complementary source follower comprises:

an n-type transistor having a gate terminal connected to the second node between the second of said first pair of the active loads and said n-type differential pair, a drain terminal connected to the first power source, and a source terminal connected to the second output node; and a p-type transistor having a gate terminal connected to the second node between the second of said second pair of the active loads and said p-type differential pair, a source terminal connected to the second output node, and a drain terminal connected to the second power source.

23. A low voltage differential signaling circuit as recited in claim 21, wherein said n-type differential pair comprises a pair of transistors having their source terminals commonly connected to said second current source, and wherein said p-type differential pair comprises a pair of transistors having their source terminals commonly connected to said first current source.

24. A low voltage differential signaling circuit as recited in claim 18, wherein said n-type differential pair comprises a pair of transistors having their source terminals commonly connected to said second current source, and wherein said p-type differential pair comprises a pair of transistors having their source terminals commonly connected to said first current source.

25. A low voltage differential signaling circuit as recited in claim 12, wherein said low voltage differential signaling circuit is a low voltage swing, low gain, high bandwidth input buffer with rail-to-rail input common-mode range.

26. In a low voltage differential signaling circuit including a first type differential pair and a pair of source followers, wherein a pair of complementary type differential pairs are provided and both receive a common differential input signal, and wherein said pair of source followers are complementary source followers that are shared by and coupled to the pair of complementary type differential pairs and wherein said pair of source followers together produce a differential output signal.

27. A low voltage differential signaling circuit, comprising a pair of complementary type differential pairs and a pair of complementary source followers, wherein said pair of complementary source followers that are shared by the pair of complementary type differential pairs, and wherein each of the complementary source followers includes a first type transistor and a second type transistor, and wherein the first type transistor operates as a current source for an active load for a second type transistor within each of the pair of complementary type differential pairs, and the second type transistor operates as a current source for an active load for a first type transistor within each of the pair of complementary type differential pairs.

28. A low voltage differential signaling circuit as recited in claim 27, wherein each of the complementary source follows provides a low impedance differential output.

* * * * *